US008752995B2

(12) United States Patent
Park

(10) Patent No.: US 8,752,995 B2
(45) Date of Patent: Jun. 17, 2014

(54) LIGHT EMITTING MODULE AND BACKLIGHT UNIT HAVING THE SAME

(75) Inventor: Jun Seok Park, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 0 days.

(21) Appl. No.: 13/369,801

(22) Filed: Feb. 9, 2012

(65) Prior Publication Data

US 2013/0051073 A1    Feb. 28, 2013

(30) Foreign Application Priority Data

Aug. 24, 2011  (KR) .................. 10-2011-0084799

(51) Int. Cl.
*H01L 33/64*        (2010.01)

(52) U.S. Cl.
USPC ............ 362/612; 362/630; 362/631; 362/294

(58) Field of Classification Search
USPC .................. 362/612, 630, 631, 294
See application file for complete search history.

(56) References Cited

U.S. PATENT DOCUMENTS

| | | | |
|---|---|---|---|
| 7,677,782 B2 * | 3/2010 | Lin et al. ............. | 362/602 |
| 8,556,489 B2 * | 10/2013 | Cheng et al. .......... | 362/612 |
| 2006/0203510 A1 * | 9/2006 | Noh et al. ............ | 362/580 |
| 2007/0229753 A1 | 10/2007 | Cheng et al. .......... | 349/161 |
| 2008/0304288 A1 * | 12/2008 | Iwasaki .............. | 362/632 |
| 2010/0123851 A1 * | 5/2010 | Mo et al. ............. | 349/58 |
| 2010/0245716 A1 * | 9/2010 | Mo et al. ............. | 349/65 |
| 2011/0007236 A1 * | 1/2011 | Kim et al. ............ | 349/58 |
| 2011/0170034 A1 | 7/2011 | Jeong ................ | 349/61 |
| 2012/0281165 A1 * | 11/2012 | Choi et al. ........... | 349/62 |

FOREIGN PATENT DOCUMENTS

EP       1 795 951 A1    6/2007

OTHER PUBLICATIONS

European Search Report dated Sep. 27, 2012 issued in Application No. 12 15 7386.

* cited by examiner

*Primary Examiner* — Nimeshkumar Patel
*Assistant Examiner* — Christopher Raabe
(74) *Attorney, Agent, or Firm* — KED & Associates LLP

(57) ABSTRACT

A light emitting module includes a plurality of light emitting diodes; and a module substrate having a wiring portion disposed with the plurality of light emitting diodes, and a heat radiation portion folded from the wiring portion and disposed under the plurality of light emitting diodes, wherein the plurality of light emitting diodes includes a first light emitting diode disposed on a first outer region of the wiring portion, a second light emitting diode disposed on a second outer region of the wiring portion, and a third light emitting diode disposed on a center of the wiring portion, and in the heat radiation portion of the module substrate, the width between the center of the wiring portion and the end of the heat radiation portion is wider than that between the first outer region of the wiring portion and the end of the heat radiation portion.

20 Claims, 5 Drawing Sheets

LIGHT EMITTING MODULE AND BACKLIGHT UNIT HAVING THE SAME

The present application claims priority under 35 U.S.C. §119(a) of Korean Patent Application No. 10-2011-0084799 filed on Aug. 24, 2011, which is hereby incorporated by reference in its entirety.

BACKGROUND

Embodiments relate to a light emitting module and a backlight unit having the same.

As information processing technology evolves, displays such as LCD, PDP and AMOLED has been widely used. The LCD among the displays requires the backlight unit generating light to display the images.

In the light emitting module, a plurality of light emitting diodes are mounted on the substrate, and driven by supplying external power source through a connector.

SUMMARY

Embodiments provide a light emitting module having a new structure and a backlight unit having the same.

Embodiments provide a light emitting module forming differently an area of the heat radiation portion of the module substrate according a region and a backlight unit having the same.

Embodiments provides provide a light emitting module formed so that the heat radiation portion of the module substrate is folded from the wiring portion mounted with the light emitting diode and the area of the heat radiation portion and gravity direction are in inverse proportion to each other, and a backlight unit having the same.

Embodiments provides a light emitting module including a plurality of light emitting diodes; and a module substrate having a wiring portion disposed with the plurality of light emitting diodes, and a heat radiation portion folded from the wiring portion and disposed under the plurality of light emitting diodes, wherein the plurality of light emitting diodes includes a first light emitting diode disposed on a first outer region of the wiring portion, a second light emitting diode disposed on a second outer region of the wiring portion, and a third light emitting diode disposed on a center of the wiring portion, and a width between the center of the wiring portion and the end of the heat radiation portion is wider than that between the first outer region of the wiring portion and the end of the heat radiation portion, in the heat radiation portion of the module substrate.

Embodiments provides a light emitting module including a plurality of light emitting diodes; and a module substrate having a wiring portion disposed with the plurality of light emitting diodes, and a heat radiation portion folded from the wiring portion and disposed under the plurality of light emitting diodes, wherein the plurality of light emitting diodes includes a first light emitting diode disposed on a first outer region of the wiring portion, a second light emitting diode disposed on a second outer region of the wiring portion, and a third light emitting diode disposed on a center of the wiring portion, and a width between the center of the wiring portion and the end of the heat radiation portion is wider than that between the first and second outer regions of the wiring portion and the end of the heat radiation portion, in the heat radiation portion of the module substrate.

Embodiments provides a backlight unit including a bottom cover including a bottom portion and a first side portion folded from the bottom portion; a light guide plate on the bottom cover; and a light emitting module comprising a module substrate including a wiring portion disposed on the inside of the first side portion of the bottom cover and corresponding to at least one side of the light guide plate, and a heat radiation portion folded from the wiring portion and disposed on the bottom portion of the bottom cover; and a plurality of light emitting diodes disposed on the wiring portion of the module substrate and corresponding to at least one side of the light guide plate, wherein the plurality of light emitting diodes includes a first light emitting diode disposed on a first outer region of the wiring portion, a second light emitting diode disposed on a second outer region of the wiring portion, and a third light emitting diode disposed on a center of the wiring portion, and a width between the center of the wiring portion and the end of the heat radiation portion is wider than that between the first outer region of the wiring portion and the end of the heat radiation portion, in the heat radiation portion of the module substrate.

DESCRIPTION OF THE PREFERRED EMBODIMENTS

Figure 1:
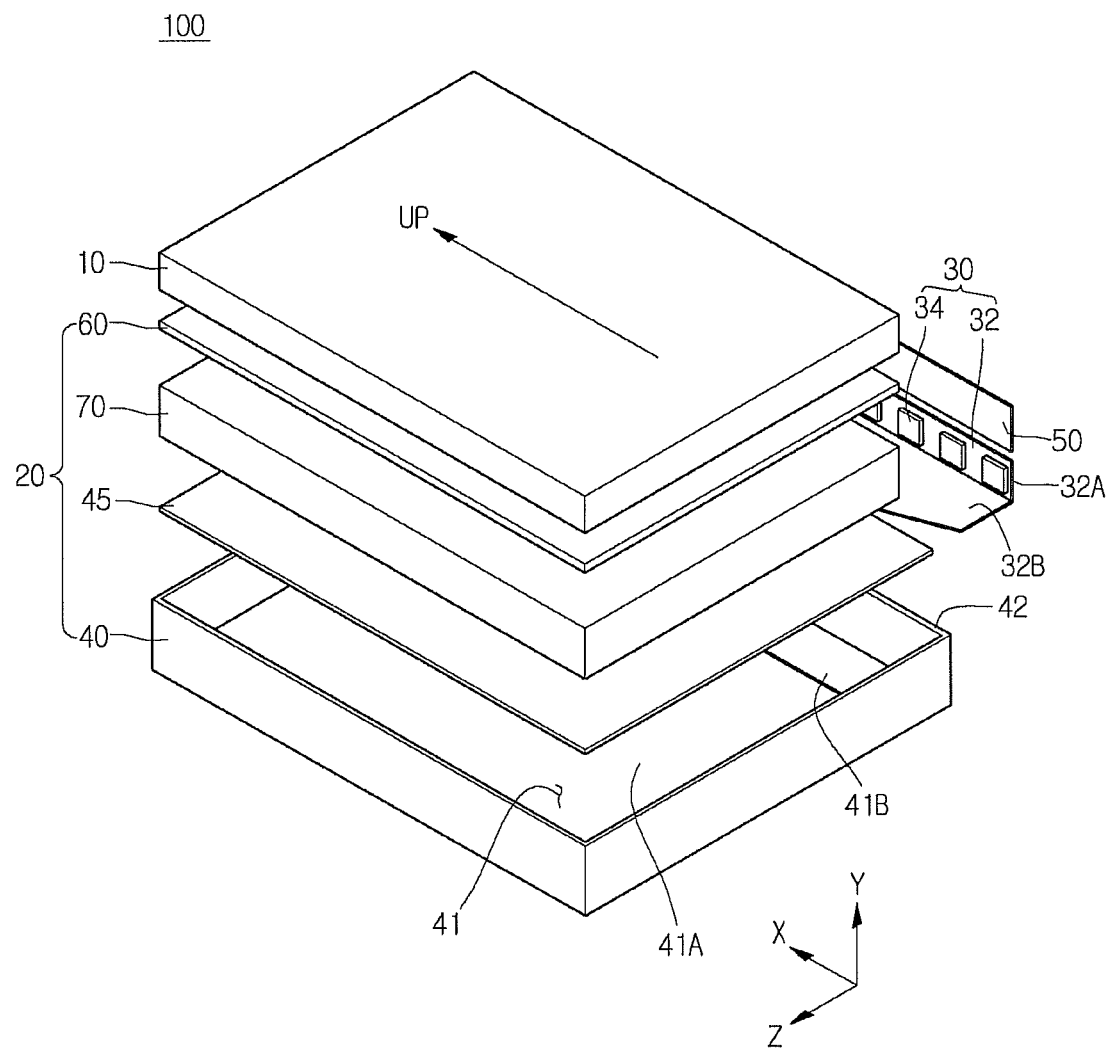
FIG. 1 is an exploded prospective view of the display apparatus of the embodiment.

In the description of the embodiment, in a case where each substrate, frame, sheet, layer or pattern and the like is described to be formed "on" or "under" thereof, "on" or "under" also means one to be formed "directly" or "indirectly (through other component)" to component. Also, the criteria regarding "on" or "under" of each component will be described based on the drawings. In the drawing, the size of each component may be exaggerated to describe, and does not mean the size that is in fact applied.

FIG. 1 is an exploded prospective view of displays of the embodiment.

Referring to FIG. 1, the display apparatus 100 includes a display panel 10 displaying images, and a backlight unit 20 providing light to the display panel 10.

The backlight unit 20 includes a light guide plate 70 providing surface illuminant to the display panel 10, a reflection member 45 reflecting leaked light, a light emitting module 30 providing the light at edge region of the light guide plate 70, and a bottom cover 40 forming the appearance of the bottom of the display apparatus 100.

Although not shown in the drawing, the display apparatus 100 may include a panel supporter supporting the display panel 10 in the bottom thereof, and a top cover forming the edge of the display apparatus 100 and surrounding the circumference of the display panel 10.

Although not shown in detail, the display panel 10 includes, for example, lower and upper substrates facing each other and coupled to be maintained with a uniform cell gap, and a liquid crystal layer (not shown) interposed between the two substrates. The lower substrate is formed with a number of gate lines and a number of data lines intersecting with a number of gate lines, and thin film transistors (TFT) may be formed in the intersecting region of the gate line and the data line. The upper substrate may be formed with color filters. The structure of the display panel 10 is not limited thereto, and the display panel 10 may have various structures. For another example, the lower substrate may include the thin film transistor and the color filter. Further, the display panel 10 may be formed by various types of the structures according to the method driving the liquid crystal layer.

Although not shown, the edge of the display panel 10 may be included with a gate driving printed circuit board (PCB) supplying scan signal to the gate lines and a data driving printed circuit board (PCB) supplying data signal to the data lines.

At least one of a top surface and a lower surface of the display panel 10 may be disposed with polarization films (not shown). A lower portion of the display panel 10 is disposed with an optical sheet 60, and the optical sheet 60 may be included in the backlight unit 20, and may include at least one prism sheet or/and diffusion sheet. The optical sheet 60 may be removed, and is not limited thereto.

Light that is incident is uniformly diffused by the diffusion sheet, and the diffused light may be condensed into the display panel by the prism sheet. Here, the prism sheet may be selectively configured by a horizontal or/and vertical prism sheet, at least one illumination reinforcement sheet etc. The kind or number of the optical sheet 60 may be added or deleted within the technical range of the embodiment, and is not limited thereto.

The light emitting module 30 may be disposed on an inside of a first side portion 42 of the sides of the bottom cover 40. For another example, the light emitting module 30 may be disposed on the side portions different from each other in the bottom cover 40, for example, both sides or all sides, and is not limited thereto.

The light emitting module 30 includes a module substrate 32, and a plurality of light emitting diodes 34 arranged in one surface of the module substrate 32.

The module substrate 32 may include any one of resin-based printed circuit board, metal core PCB, flexible PCB, ceramic PCB, and FR-4 substrate. The inside of the module substrate 32 may be included with the printed circuit boards having metal layers.

The plurality of light emitting diodes 34 are corresponded in the direction of a light entrance edge of the light guide plate 70 at a predetermined pitch, and arranged along a first direction X of the module substrate 32. At least one of the plurality of light emitting diodes 34 may emit, for example, at least one of white, red, green, and blue. In the embodiment, the light emitting diode emitting the light having at least one color may be used, or it is possible to use a combination of the light emitting diodes emitting a plurality of colors.

The light emitting diodes 34 may include light emitting chips using group III-V compound semiconductors, and molding members protecting the light emitting chips. The molding member may be added with at least one kind of a phosphor, and is not limited thereto. The light emitting chips may emit visible wavelengths or ultraviolet light.

The light emitting diodes 34 may be disposed by at least one row, and may be arranged at regular or irregular intervals.

The module substrate 32 includes a wiring portion 32A and a heat radiation portion 32B, the light emitting diodes 34 is disposed on the wiring portion 32A, the heat radiation portion 32B is folded from the wiring portion 32A and may be disposed with angles (for example: 85~95°) almost vertical to the wiring portion 32A, for example, substantially orthogonally. The module substrate 32 may be formed in the shape of, for example, 'L' character. The heat radiation portion 32B may not be disposed with the light emitting diodes 34, and may be formed of the region folded from the wiring portion 32A. The heat radiation portion 32B is disposed under the plurality of light emitting diodes 34, and is extended longer than the thickness of the light emitting diodes 34.

Here, in the module substrate 32, X-axis direction may be defined in the length direction thereof, Z-axis direction may become the width direction of the heat radiation portion 32B, and Y-axis direction may become the width direction of the wiring portion 32A. The Z-axis direction is orthogonal to the Y-axis direction, and the Z-axis direction and the Y-axis direction are orthogonal to the X-axis direction.

The heat radiation portion 32B is showed as the folded structure in a lower direction of the wiring portion 32A, but may be folded so as to be faced each other in both directions (for example, top and lower directions) of the wiring portion 32A, and is not limited thereto.

The width of the heat radiation portion 32B may be wider than the width of the wiring portion 32A, and the width may be controlled in consideration of the heat radiation efficiency. The thickness of the wiring portion 32A may be formed thicker than that of the heat radiation portion 32B.

The wiring portion 32A of the module substrate 32 may be connected to a first side portion 42 of the bottom cover 40 and a connecting member 50. The connecting member 50 may include adhesive member. The wiring portion 32A of the module substrate 32 may be connected to the first side portion 42 using a fastening member rather than the connecting member.

The wiring portion 32A of the module substrate 32 may be disposed with connectors. The connectors may be disposed on at least one of the top and lower surfaces of the module substrate 32, and is not limited thereto.

At least one side (that is, the light entrance edge) of the light guide plate 70 is corresponded with the plurality of light emitting diodes 34 disposed on the wiring portion 32A of the module substrate 32. The heat radiation portion 32B of the module substrate 32 is corresponded to the lower surface of the light guide plate 70, and may be disposed in parallel with the lower of the module substrate 32. The light generated from the plurality of light emitting diodes 34 is incident on at least one side (that is, the light entrance edge) of the light guide plate 70. The plurality of light emitting diodes 34 may be disposed on the wiring portion 32A by top view method, and is not limited thereto.

The light guide plate 70 may be formed in a shape of a polygon including a top surface on which the surface illuminant is generated, a lower surface opposite to the top surface, and at least four sides. The light guide plate 70 is formed of transparent material, and may contain, for example, one of acrylic resin such as polymethyl metaacrylate (PMMA), polyethylene terephthlate (PET), poly carbonate (PC), cycloolefin copolymer (COC) and polyethylene naphthalate (PEN) resin. The light guide plate 70 may be formed of extrusion molding, and is not limited thereto.

The top/on/and lower surface of the light guide plate 70 may be formed with reflection patterns (not shown). The reflection patterns including predetermined patterns, for example, the reflection patterns or/and prism patterns reflect or/and irregularly reflect the light that is incident, and therefore, the light may be regularly irradiated through the entire surface of the light guide plate 70. The lower surface of the light guide plate 70 may be formed of the reflection patterns, and the top surface may be formed by the prism patterns. The inside of the light guide plate 70 may be added with scattering agents and is not limited thereto.

A reflection member 45 is disposed under a lower portion of the light guide plate 70. The light proceeding under the light guide plate 70 is reflected in the direction of the display panel by the reflection member 45. A portion of the reflection member 45 is disposed under an incident light portion of the light guide plate 70, or may be disposed under the plurality of the light emitting diodes 34. The portion of the reflection member 45 may be disposed between the light guide plate 70 and the heat radiation portion 32B. The reflection member 45 may be formed of, for example, PET, PC, PVC resin, etc., but is not limited thereto. The reflection member 45 may be the reflection layer formed on the top surface of the bottom cover 40, but is not limited thereto. The light leaked into the lower surface of the light guide plate 70 may be incident again into the light guide plate 70 by the reflection member 45. As a result, the light efficiency of the backlight unit 20 is improved, and problems such as the lowering of the light characteristic and the generation of dark portions may be prevented.

The bottom cover 40 includes an receiving portion 41 opened with the top, and the receiving portion 41 may be accommodated with the light emitting module 30, the optical sheet 60, the light guide plate 70, and the reflection member 45. The bottom cover 40 may be selectively formed among the metal having high heat radiation efficiency, for example, aluminum (Al), magnesium (Mg), zinc (Zn), titanium (Ti), tantalum (Ta), hafnium (Hf), niobium (Nb) and their selective alloys. The bottom cover 40 may be formed of the resin material, but is not limited thereto.

The receiving portion 41 of the bottom cover 40 may be sequentially stacked with the reflection member 45, the light guide plate 70, and the optical sheet 60, and the light emitting module 30 is corresponded to one side of the light guide plate 70 in the first side portion 42 of the bottom cover 40.

A bottom portion 41A of the bottom cover 40 is formed with a recess portion 41B, and the recess portion 41B is coupled with the heat radiation portion 32B of the module substrate 32. The recess portion 41B may be formed with the same depth as the thickness of the heat radiation portion 32B and the same width as that of the heat radiation portion 32B and is not limited thereto.

In the embodiment, the recess portion 41B is disposed in the portion folded from the first side portion 42 of the bottom portion 41A of the bottom cover 40, but the recess portion 41B may be not formed.

When disposing the display apparatus 100, it is possible to allow an UP direction to be disposed upwardly. The heat generated from the light emitting diodes 34 of the light emitting module 30 is moved in the UP direction, that is, in the direction opposite to gravity by such a disposing direction. In the embodiment, the heat radiation portion 32B of the light emitting module 30 may further improve the heat radiation efficiency by more widening the area of the region disposed in the disposing direction of the display apparatus 100, that is, in the direction opposite to gravity. Further, for optimal heat radiation efficiency according to the disposing direction of the display apparatus 100 and the distribution of the heat generated from a plurality of light emitting diodes 34, the area and the width of the heat radiation portion 32B are considered.

Figure 2:
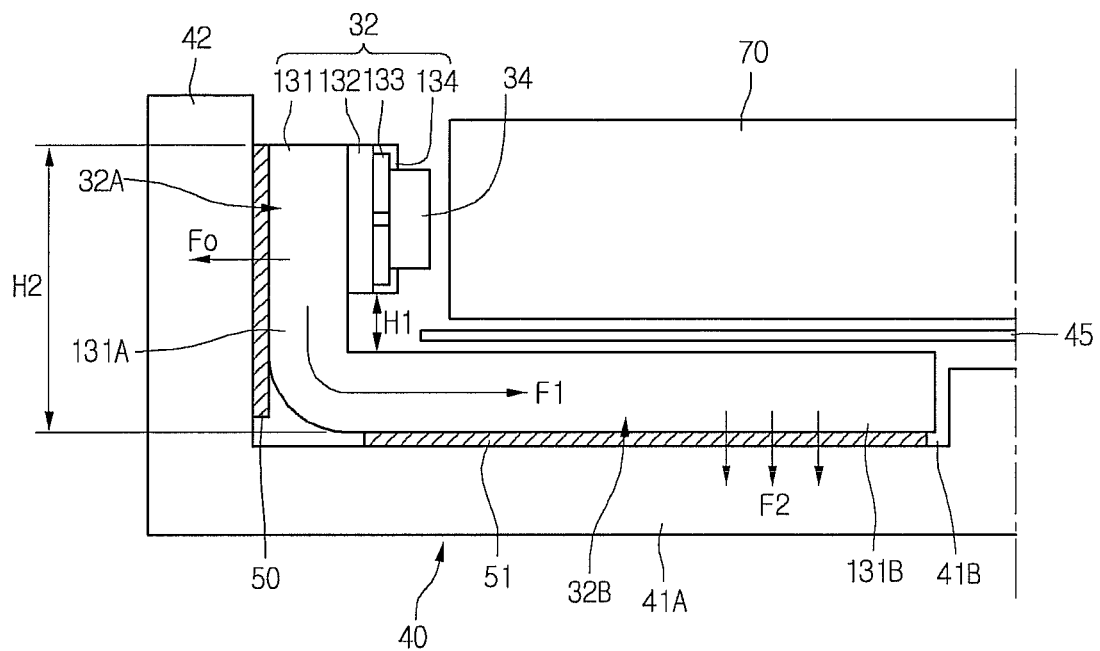
FIG. 2 is a partially side cross-sectional view of a backlight unit of FIG. 1.
Figure 3:
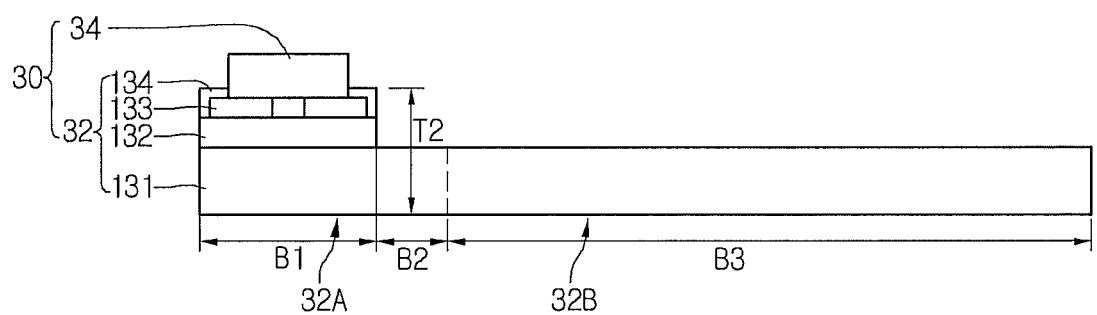
FIG. 3 shows an example for a light emitting module of FIG. 2.

Referring to FIGS. 2 and 3, the module substrate 32 includes a metal layer 131, an insulation layer 132 on the metal layer 131, an wiring layer 133 on the insulation layer 132, and a protection layer 134 on the wiring layer 133.

The metal layer 131 contains at least one of Al, Cu, and Fe, is disposed on the entire lower surface of the module substrate 32, and therefore, is used as the heat radiation plate. The metal layer 131 may use the plate having copper (Cu) material, for example, for the fold and the heat radiation efficiency. The metal layer 131 may have the thickness of 0.8 mm~1.5 mm. A width of the lower surface of the metal layer 131 may be formed as the same width as that of the module substrate 32. The area of the lower surface of the metal layer 131 may be formed as the same area as that of the module substrate 32.

The metal layer 131 may be include a first heat radiation portion 131A and a second heat radiation portion 131B by folding a flat structure of FIG. 3 based on the boundary between a second region B2 and a third region B3. Here, the second region B2, which is a buffer region protecting the folded portion, may be formed in the range of 0.8 mm or more, for example, 0.8~1 mm. The first region B1 becomes the wiring pattern region of the wiring portion 32A.

The insulation layer 132 is disposed on the metal layer 131, the insulation layer 132 contains preimpregnated materials, and may contain, for example, epoxy resin, phenol resin, and unsaturated polyester resins etc. The insulation layer 132 may have the thickness of 80~100 μm, and the width thereof may be formed narrower than the width (or area) of the metal layer 131.

The wiring layer 133 includes the circuit pattern, contains at least one of Cu, Au, Al, and Ag, and may use, for example, copper (Cu). The wiring layer 133 may have the thickness of 25~70 μm, may be formed thinner than the thickness of the insulation layer 132, and is not limited thereto.

A protection layer 134 is disposed on the wiring layer 133, the protection layer 134 includes solder resist, and the solder resist protects the region except the pad on the top surface of the module substrate 32. The protection layer 131 may have the thickness of 15~30 μm. The module substrate 32 may be formed with via holes, but is not limited thereto. In another example, the module substrate 32 may be disposed with a plurality of wiring layers, and an insulation layer may be further disposed between the plurality of wiring layers.

The light emitting diodes 34 are mounted on the wiring layer 133 of the module substrate 32, and the light emitting diodes 34 may be disposed as series, parallel, or mixed series-parallel structures by the circuit pattern of the wiring layer 133.

The module substrate 32 includes the wiring portion 32A and the heat radiation portion 32B, and the wiring portion 32A is formed of a stacked structure configured with the metal layer/the insulating layer/the wiring layer/the protection layers (131/132/133/134), and the heat radiation portion 32B is formed of the metal layer 131. Here, the metal layer 131 includes a first heat radiation portion 131A and a second heat radiation portion 131B, the first heat radiation portion 131A becomes a bottom layer of the wiring portion 32A, and the second heat radiation portion 131B becomes the heat radiation portion 32B. The second heat radiation portion 131B may have a width wider than the first heat radiation portion 131A. The first heat radiation portion 131A and the second heat radiation portion 131B may be formed as the same thickness, and is not limited thereto.

A gap H1 between the top surface of the second heat radiation portion 131B and the insulation layer 132 may be formed in the range of 0.8 mm~1 mm, and the insulation layer 132 is spaced apart from the folded portion between the first heat radiation 131A and the second heat radiation portion 132B by such the gap H1, thereby to improve the problem such as the generation of dust by the insulation layer 132 or the lowering of the heat radiation effects. This reduces the region occupied with the insulation layer 132 among the region on the metal layer 131, thereby to prevent the lowering of the heat radiation effect when the insulation layer 132 covers the metal layer 131. Further, when the insulation layer 132 is disposed on the folded portion, cracks occur in the folded portion, or to affect the circuit pattern may be prevented.

Further, the insulation layer 132 is spaced apart from the folded portion between the heat radiation portion 32B and the wiring portion 32A, such that the gap between the wiring portion 133 and the folded portion may be further reduced. The reduction of such a gap may reduce the thicknesses of the light emitting module 30 and the backlight unit 20 including the same.

The top surface of the heat radiation portion 32B is disposed as the same plan as the bottom surface of the bottom cover 40 or may be disposed higher or lower than the bottom surface of the bottom cover 40, and is not limited thereto.

The height H2 of the light emitting module 30, which is the distance from the lower surface of the heat radiation portion 32B to the top surface of the module substrate 32, may be formed in the range of 9 mm~13 mm, and is not limited thereto.

An adhering member 50 is disposed between a first side portion 42 of the bottom cover 40 and the wiring portion 32A of the module substrate 32, and the wiring portion 32A of the module substrate 32 is adhered to a second side portion 42 of the bottom cover 40 by the adhering member 50. The recess portion 41B formed in the bottom portion 41A of the bottom cover 40 may be adhered with the heat radiation portion 32B of the module substrate 32 by the adhering member 51. The bottom portion 41A of the bottom cover 40 may not be formed with the recess portion 41B, and is not limited thereto.

In the embodiment, when the heat is generated from the light emitting diode 34, some heat is conducted through the first heat radiation portion 131A of the module substrate 32 to perform the heat radiation into the path F0 through the first side portion 42 of the bottom cover 40, and the other heat is conducted into the second heat radiation portion 131B of the module substrate 32 to perform the heat radiation into the paths F1 and F2 through the bottom portion 41A of the bottom cover 40.

Figure 4:
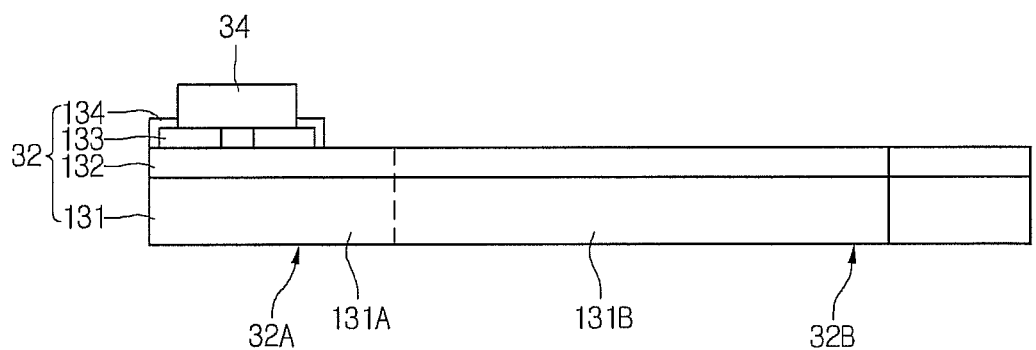
FIG. 4 shows another example for the light emitting module of FIG. 2.

FIG. 4 is another example of the light emitting module.

In the light emitting module of FIG. 4, the metal layer 131 and the insulation layer 132 of the module substrate 32 may be formed as the same width. The entire top surface of the metal layer 131 is formed with the insulation layer 132, and the insulation layer 132 may reinforce the strength of the metal layer 131. Further, when manufacturing the insulation layer 132, since the top surface of the metal layer is not exposed, there is an effect that separate mask layers are not disposed on the metal layer.

Figure 5:
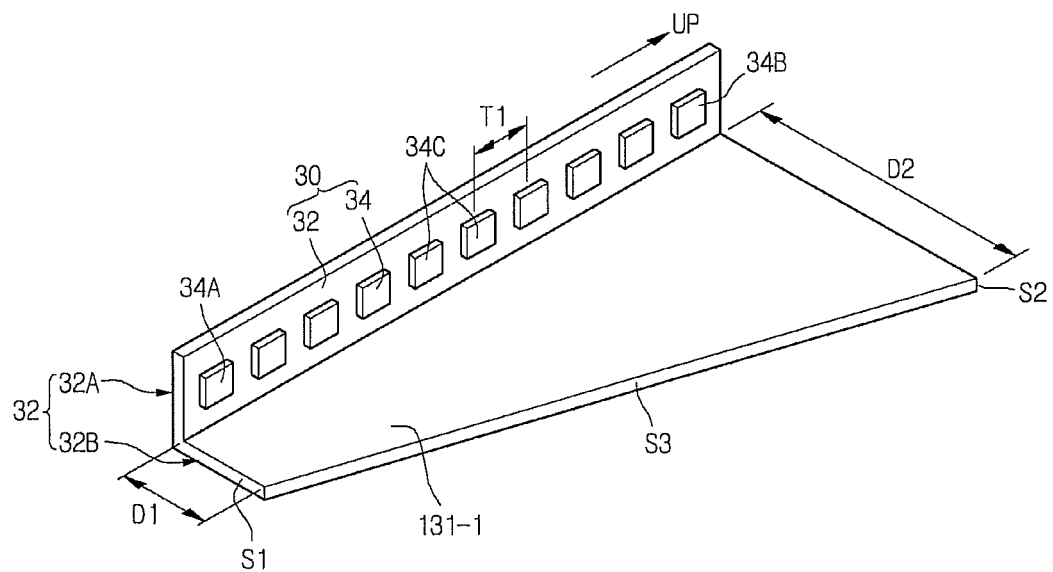
FIG. 5 shows the light emitting module according to a first embodiment.

FIG. 5 is a prospective view showing the light emitting module according to a first embodiment.

In the light emitting module 30 of FIG. 5, the closest light emitting diode to the first side S1 of the heat radiation portion 32B is defined as a first light emitting diode 34A, and the closest light emitting diode to the second side S2 opposite to the first side S1 of the heat radiation portion 32B is defined as a second light emitting diode 34B, and the light emitting diodes disposed on a center of the region between the first light emitting diode 34A and the second light emitting diode 34B may be defined as a third light emitting diode 34C, among the plurality of light emitting diodes 34. Further, the first light emitting diode 34A is disposed on the first outer region of the wiring portion 32A, the second light emitting diode 34B is disposed on the second outer region of the wiring portion 32A, and the third light emitting diode 34C may be disposed on the center of the wiring portion 32A. The first outer region and the second outer region may be the regions adjacent to the sides opposite to each other in the wiring portion 32A. Here, a position of the first light emitting diode 34A is down direction, and the position of the second light emitting diode 34B is up direction. Further, an interval T1 between the light emitting diodes 34 may be the same or different in part, and is not limited thereto. The plurality of light emitting diodes 34 may be disposed on a line having the same center.

The width D2 of the second side S2 of the heat radiation portion 32B, which is an interval between the wiring portion 32A and a third side S3 of the heat radiation portion 32B, may have the width wider than the width D1 of the first side S1 of the heat radiation portion 32B adjacent to the first outer region of the wiring portion 32A. Further, the width D2 of the top surface of the heat radiation portion 32B corresponding to a lower portion of the second light emitting diode 34B, which is an interval between a second outer region of the wiring portion 32A and the third side S3 of the heat radiation portion 32B, may have the width wider than the width D1 of the top surface of the heat radiation portion 32B corresponding to a lower portion of the first light emitting diode 34A. Here, the widths D1 and D2 become an interval between the wiring portion 32A and the end of the heat radiation portion 32B, that is, the third side S3. The widths D1 and D2 of each side S1 and S2 of the heat radiation portion 32B may be the width of the top surface adjacent to each of the sides S1 and S2.

The third side S3, which is surface between the first side S1 and the second side S2 of the heat radiation portion 32B, may be formed as the inclined surface for the first side S1 or/and the second side S2. The third side S3 may be formed by a subsequent surface.

In the top surface 131-1 of the heat radiation portion 32B, the interval between the first light emitting diode 34A and the third side S3 is the narrowest, the interval between the second light emitting diode 34B and the third side S3 is wider than the interval between the first light emitting diode 34A and the third side S3, and is the widest in the region of the top surface 131-1.

Thus, the area of the heat radiation 32B is gradually disposed widely toward the second light emitting diode 34B, such that the heat may be centered on the second and third light emitting diodes 34B and 34C rather than the first light emitting diode 34A disposed in the direction in which the heat proceeds, thereby to have uniform heat distribution in the heat radiation 32B by different area of the heat radiation portion 32B.

As another example, the heat radiation portion 32B may include uneven structures. In the uneven structures, the lower portion of the region between the second light emitting diode 34B and the third light emitting diode 34C is formed with at least one of the concave portion or the convex portion, thereby to increase the area of the heat radiation portion 32B. The uneven structures may be formed in a shape of stripe or polygon in the third direction S3 of the heat radiation portion 32B from the wiring portion 32A, and may be disposed in one or a plurality of.

Figure 6:
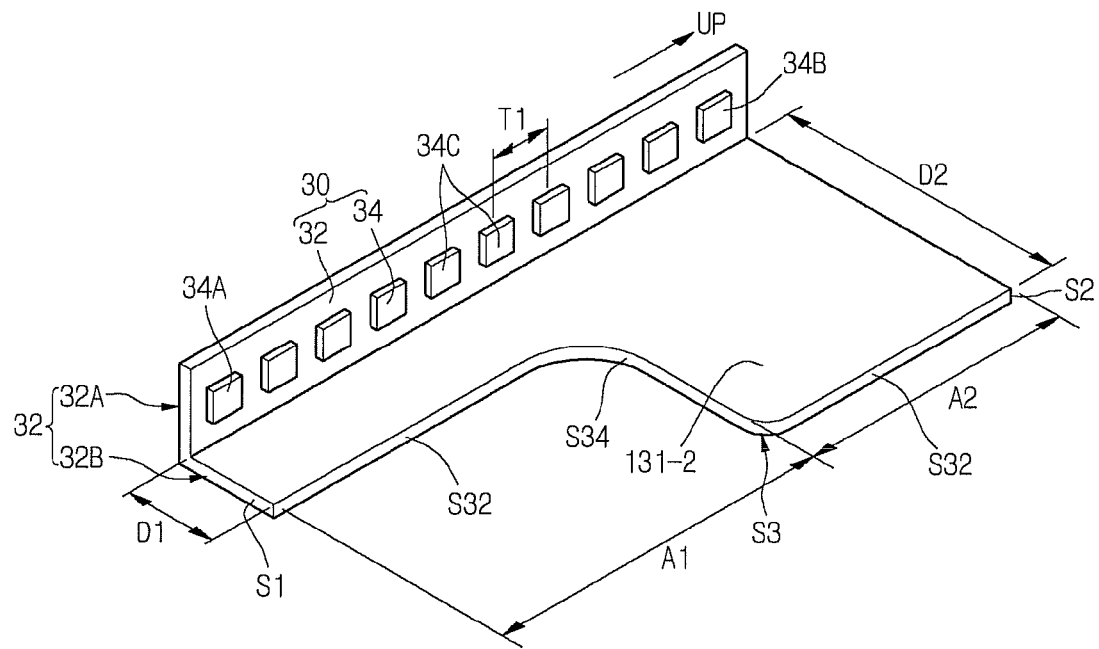
FIG. 6 shows the light emitting module according to a second embodiment.

FIG. 6 is a perspective view showing the light emitting module according to a second embodiment.

Referring to FIG. 6, the light emitting module 32 may be classified into a lower first region A1 and an upper second region A2 on the center of the top surface 131-2 of the heat radiation portion 32B. The lowering first region A1 is formed of a first width D1, and the upper second region A2 may be formed of a second width D2.

The side S3 of the heat radiation portion 32B includes first surfaces S32 disposed at right angles for the first side S1 and the second side S2, and a second surface S34 disposed between first surfaces S32 and in parallel with the second side S2. A corner portion between the first surface S32 and the second surface S34 may be formed of a curved surface or may be folded at a right angle, and is not limited thereto.

The second region A2 of the heat radiation portion 32B, which is the region between the second and third light emitting diodes 34B and 34C, and the interval between the second light emitting diodes 34B and the third side S3 of the heat radiation portion 32B, may be formed of the width D2 of the second side S2.

The first region A1 of the heat radiation portion 32B, which is the region between the first and third light emitting diodes 34A and 34C and the interval between the first light emitting diodes 34A and the third side S3 of the heat radiation portion 32B, may be formed of the width D1 of the first side S1.

The structures may efficiently heat-radiate when the heat generated from the plurality of light emitting diodes 34 is further concentrated in the center of the display apparatus.

As another example, the second region A2 of the heat radiation portion 32B may include uneven structures. In the uneven structures, the lower portion of the region between the second light emitting diode 34B and the third light emitting diode 34C is formed with at least one of the concave portion or the convex portion, thereby to increase the area of the heat radiation. The uneven structures may be formed in a shape of stripe or polygon in the third direction S3 of the heat radiation portion 32B from the wiring portion 32A, and may be disposed in one or a plurality of.

Figure 7:
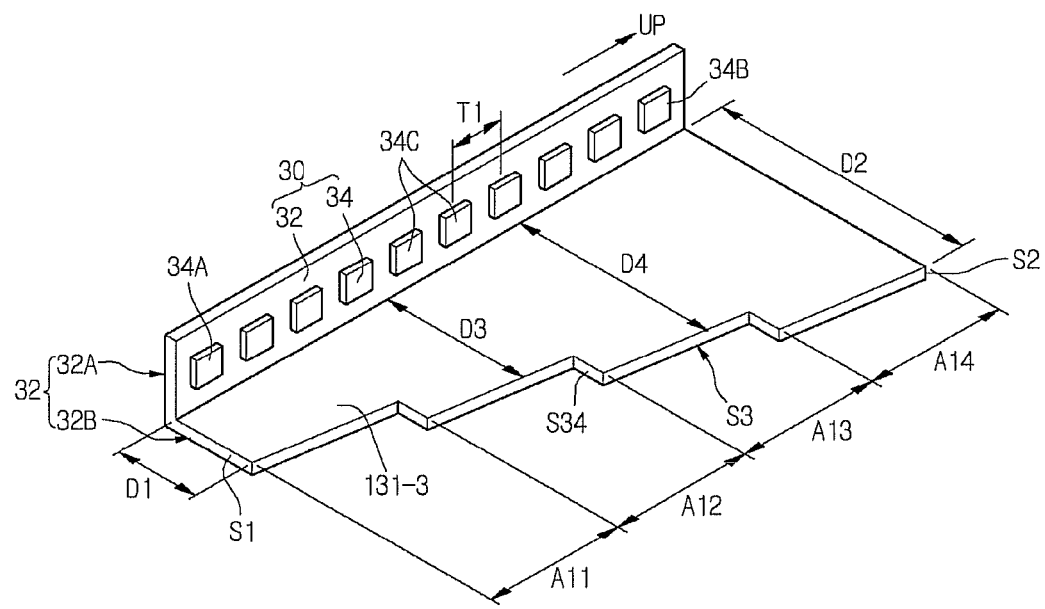
FIG. 7 shows the light emitting module according to a third embodiment.

FIG. 7 is a prospective view showing the light emitting module according to a third embodiment.

Referring to FIG. 7, in the heat radiation portion 32B of the light emitting module 32, the area and width of the top surface 131-3 is formed of the structure increased gradually in a step type toward the UP direction according to the region A11 to A14. Further, the third side S3 of each of the region A11 to A14 may be gradually widened from the first side S1 direction toward the second side S2 direction. The third side S3 may be formed of discontinuous inclined sides. The third surface S34 connecting the third side S3 between the regions A11 to A14 is corresponded to the second side S2, may be disposed in parallel with the second side S2, and is not limited thereto The first region A11 is disposed in the first light emitting diode 34A and the lower portion of the region adjacent to the first light emitting diode 34A, the fourth region A14 is disposed on the second light emitting diode 34B and the lower portion of the region adjacent to the second light emitting diode 34A, and the second and third regions A12 and A13 are disposed on the third light emitting diode 34C and the lower portion of the region adjacent to the third light emitting diode 34C.

The area of the top surface 131-3 of the heat radiation portion 32B may have the widths D1, D2, D3 and D4 different according to each of the regions A11, A14, A12, and A13. For example, the width D3 of the first region A12 is formed wider than the width D1 of the first region A11, the width D4 of the third region A13 is formed wider than the width D3 of the second region A12, the width D2 of the fourth region A14 is the widest and formed wider than the width D3 of the second region A12.

In the light emitting module, the area of the heat radiation portion 32B may be different according to the regions A11 to A14, thereby to provide heat stability of the light emitting diode 34 for each regions A11 to A14. In the embodiment, four regions are disposed as step structures, but it is possible to form the region in three or more, and is not limited thereto. Further, the lengths of each of the regions A11 to A14 are the same or different from each other, for example, the length of the fourth region A14 may be formed as the longest length. At least one of each of the regions A11 to A14 may be formed with the uneven structure, and is not limited thereto.

Figure 8:
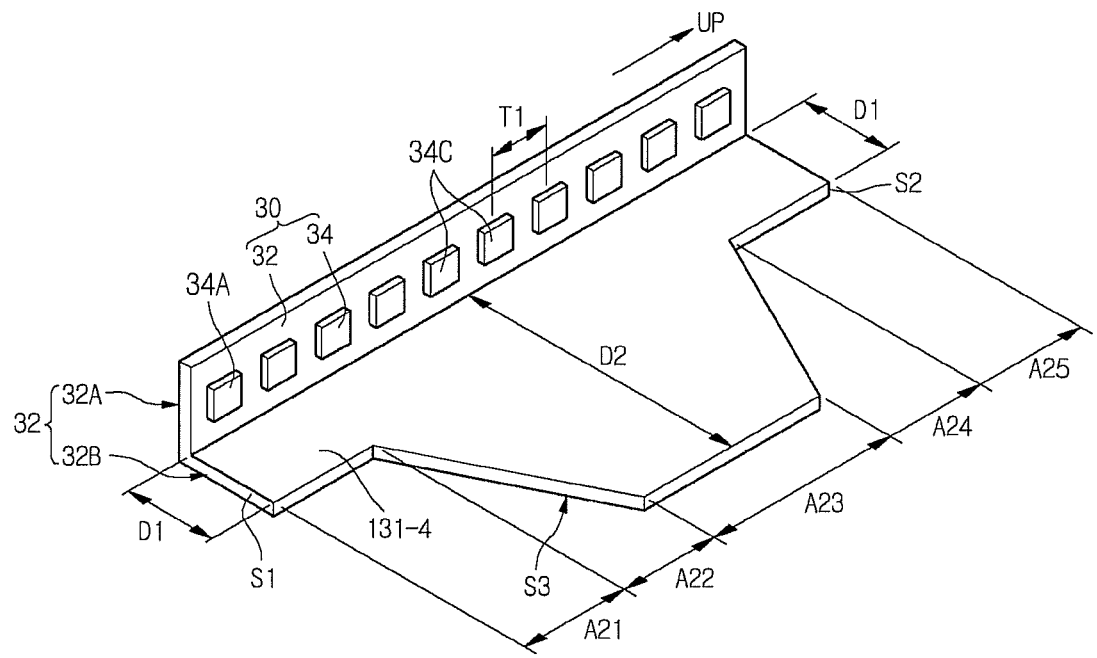
FIG. 8 shows the light emitting module according to a fourth embodiment.

FIG. 8 is a prospective view showing the light emitting module according to a fourth embodiment.

Referring to FIG. 8, the heat radiation portion 32B of the light emitting module 32 includes a first region A21 and fifth region A25 having a first width D1, a third region A23 having a second width D2 between the first and fifth regions A21 and A25, a second region A22 connecting the first region A21 and the third region A23 and having the inclined surface S31, and a fourth region A24 connecting the third region A23 and the fifth region A25 and having the inclined surface S33. Here, the first, third and fifth regions A21, A23 and A25 may be regions in which at least two light emitting diodes are disposed, the second and fourth regions A22 and A24, which is the region having the area smaller than the area of the third region A23, may be regions in which at least one light emitting diodes is disposed, but is not limited thereto.

In the top surface 131-4 of the heat radiation portion 32B of the light emitting module 32, the area and width of the center region, that is, the third region A23 is disposed wider as compared with other regions, and it may be prevented that the heat generated from the plurality of light emitting diodes 34 disposed on each of the regions A21, A22, A23, A24 and A25 affects other regions, for example, the light emitting diodes in the UP direction.

Here, the gap between the third light emitting diode 34C disposed on the center of the light emitting module 32 and the third side S3 of the heat radiation portion S3 may be disposed wider than the interval between the first and second light emitting diodes 34A and 34B disposed on the down and up direction rather than the center and the third side S3 of the heat radiation portion. The interval between the center of the wiring portion 32A and the third side S3 of the heat radiation portion 32B may be disposed wider than the interval between the first and second regions of the wiring portion 32A and the third side S3 of the heat radiation portion 32B. The light emitting module 32 allows the heat ascending from the direction opposite to the up direction to the up direction to heat-radiate by the center region of the light emitting module 32, that is, the third region A23 and the region adjacent to the same, that is, the heat radiation portion 32B of the second and fourth regions A22 and A24, and therefore, the second light emitting diode 34B disposed on the fifth region A25 may be operated without subjecting to interference caused by the heat transferred from the lower portion of the third region A23.

For another example, the third region A23 of the heat radiation portion 32B may be formed with the uneven structure, and the uneven structure may be formed in the shape of the stripe or the polygon. The third region A23 of the heat radiation portion 32B may be formed with the uneven structure, thereby to increase the area of the heat radiation.

Figure 9:
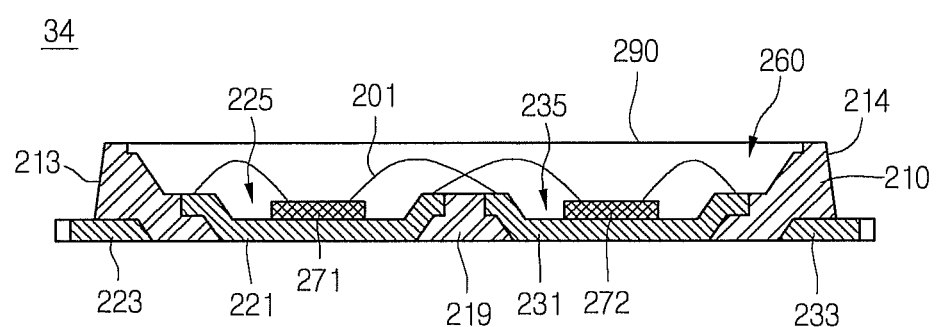
FIG. 9 shows an example for a light emitting diode of FIG. 1.

FIG. 9 is a side cross-sectional view showing an example of the light emitting device of the embodiment.

Referring to FIG. 9, the light emitting diode 34 includes a body 210 having a first cavity 260, a first lead frame 221 having a second cavity 225, a second lead frame 231 having a third cavity 235, and light emitting chips 271 and 272, and wires 201.

The body 210 may be made of at least one of resin material such as polyphthalamide (PPA), silicon (Si), metal material, photo sensitive glass (PSG), sapphire (Al$_2$O$_3$), and printed circuit board (PCB). Preferably, the body 210 may be made of the resin material such as polyphthalamide (PPA).

The shape of the top of the body 210 may have various shapes such as triangles, rectangles, and polygons according to use and design of the light emitting device package. The first lead frame 221 and the second lead frame 231 are disposed under the body 210 and may be mounted on the substrate in a direct lighting type. The first lead frame 221 and the second lead frame 231 are disposed on the side of body 210 and may be mounted on the substrate in an edge type, but is not limited thereto.

The top of the body 210 is opened, and has a first cavity 260 forming a side and lower surfaces. The first cavity 260 may include a concave cup or a recess structure from the top 215 of the body 210, and is not limited thereto. The side of the first cavity 260 may be vertical or inclined to the bottom of the first cavity 260. The shape of the first cavity 260 as seen from the top surface may be a circle, ellipse, polygon (for example, quadrangle). A corner of the first cavity 260 may be the curved surface or a flat surface.

The first lead frame 221 is disposed on the first region of the first cavity 260, and the portion of the first lead frame 221 is disposed under the first cavity 260. A concave second cavity 225 is disposed to have a depth lower than the bottom of the first cavity 260 in the center thereof. The second cavity 225 is a concave shape from the top surface of the first lead frame 221 to the lower surface of the body 210, and includes, for example, the cup structure or the recess shape. The side of the second cavity 225 is inclined or may be vertically folded to the bottom of the second cavity 225. Two sides facing each other among the side of the second cavity 225 may be inclined at the same angle or at different angle from each other.

The second lead frame 231 is disposed on the second region to be spaced apart from the first region of the first cavity 260, and the portion of the second lead frame 231 is disposed under the first cavity 260. A concave third cavity 235 is formed to have a depth lower than the bottom of the first cavity 260 in the center thereof. The third cavity 235 is a concave shape from the top surface of the second lead frame 231 to the lower surface of the body 210, and includes, for example, the cup structure or the recess shape. The side of the third cavity 235 is inclined or may be vertically folded to the bottom of the third cavity 235. Two sides facing each other among the side of the third cavity 235 may be inclined at the same angle or at different angle from each other.

The lower surfaces of the first lead frame 221 and the second lead frame 231 are exposed to the lower surface of the body 210, or may be arranged on the same plane as the lower surface of the body 210. A gap 219 between the first lead frame 221 and the second lead frame 231 may be disposed on the center, and at least portion of it may be in contact with the top surfaces of the first lead frame 221 and the second lead frame 231. The end of the first lead frame 221 and the second lead frame 231 being in contact with the gap 219 may be formed with humidity preventing patterns such as the step structure or/and the uneven pattern, and is not limited thereto.

The first lead portion 223 of the first lead frame 221 is disposed on the lower surface of the body 210, and may be protruded under the first side 213 of the body 210. A second lead portion 233 of the second lead frame 231 is disposed on the lower surface of the body 210, and may be protruded under a second side 214 opposite to the first side of the body 210.

The first lead frame 221 and the second lead frame 231 may contain at least one of metal material, for example, titanium (Ti), copper (Cu), nickel (Ni), gold (Au), chromium (Cr), tantalnyum (Ta), platinum (Pt), tin (Sn), silver (Ag), phosphorus (P), may be formed of a single metal layer or multi-layer metal layers. The thickness of the first and second lead frames 221 and 231 may be formed as the same thickness, and is not limited thereto.

The bottom shape of the second cavity 225 and the third cavity 235 may be rectangle, square, or circle or ellipse having the curved surface.

The body 210 is further disposed with the other metal frame except the first and second lead frames 221 and 231 to use as the heat radiation frames or intermediate connecting terminals. The first and second lead frames 221 and 231 are spaced apart from each other by the gap 219, and supports the space between the first and second lead frames 221 and 231. The top surface of the gap 219 is the same as or may be protruded highly from the top surface of the first and second lead frames 221 and 231, and is not limited thereto.

The first light emitting chip 271 is disposed on the second cavity 225 of the first lead frame 221, and the second light emitting chip 272 is disposed on the third cavity 235 of the second lead frame 231. The light emitting chips 271 and 272 may be selectively emit among the range from visible light band to ultraviolet light band, and may be selected among, for example, a red LED chip, a blue LED chip, a green LED chip and a yellow green LED chip. The light emitting chips 271 and 272 includes compound semiconductor light emitting device of group III to V element.

A molding member 290 is disposed in at least one region among the first cavity 260 of the body 210, the second cavity 225 and the third cavity 235. The molding member 290 includes a transmissive resin layers such as silicon or epoxy in one or a plurality of. A phosphor changing wavelengths of the light to be emitted may be included in the molding member 290 or the light emitting chips 271 and 272, some of the light emitted from the light emitting chips 271 and 272 is excited by the phosphor and is emitted as the light having different wavelengths. The phosphor may be selectively formed among YAG, TAG, silicate, nitride, and oxy-nitride-based material. The phosphor may include at least one of red, yellow and green phosphors, and is not limited thereto. The surface of the molding member 290 may be formed as flat, concave and convex shape etc. and is not limited thereto.

The lens may be further formed on the top of the body 210, the lens may include the structure of concave or/and convex lens, and light distribution of the light emitted by the light emitting device may be controlled.

The first light emitting chip 271 may be connected to the first lead frame 221 and the second lead frame 231 disposed on the bottom of the first cavity 260, and the connection method thereof uses the wires 201, die bonding or flip bonding type. The second light emitting chip 272 may be electrically connected to the first lead frame 221 and the second lead frame 231 disposed on the bottom of the first cavity 260, and the connection method thereof uses the wires 201, die bonding or flip bonding type.

The protection device may be arranged in the predetermined region of the first cavity 260, the protection device may be implemented by a thyristor, a zener diode or transient voltage suppression (TVS), the zener diode protects the light emitting chip from electro static discharge (ESD).

The light emitting module of the embodiment may be applied to backlight units such as portable terminal and computer, and illumination systems such as lighting, traffic lights, vehicle headlight, electronic display and streetlamp, and is not limited thereto. Further, the light emitting of direct lighting type may not be disposed with the light guide plate, and is not limited thereto. Further, a transmissive materials such as lens or glass may be disposed on the light emitting module, and is not limited thereto.

The present invention is not limited by the above-described embodiment and the accompanying drawings, and is limited by the attached claims. In addition, although the preferred embodiments of the present invention are shown and described above, the present invention is not limited to above-described specific embodiment and is variously modified by one skilled in the art without the gist of the present invention claimed in the claim, such that the modified embodiment is not to be understood separately from technical ideas or views of the present invention.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effects such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting module, comprising:
a plurality of light emitting diodes; and
a module substrate including a wiring portion disposed with the plurality of light emitting diodes and electrically connected to the plurality of light emitting diodes, and a heat radiation portion folded from the wiring portion and disposed under the plurality of light emitting diodes,
wherein the plurality of light emitting diodes includes a first light emitting diode disposed on a first outer region of the wiring portion, a second light emitting diode disposed on a second outer region of the wiring portion, and a third light emitting diode disposed on a center of the wiring portion,
wherein a width between the center of the wiring portion and an end of the heat radiation portion is wider than a distance between the first outer region of the wiring portion and the end of the heat radiation portion, in the heat radiation portion of the module substrate,
wherein the wiring portion of the module substrate includes a metal layer, a wiring layer on the metal layer, and an insulating layer between the metal layer and the wiring layer,
wherein the heat radiation portion is extended from the metal layer, and the heat radiation portion is spaced apart from the insulating layer and the wiring layer, and
wherein the wiring layer is electrically connected to the plurality of the light emitting diodes,
wherein the metal layer of the wiring portion is bent from the heat radiation portion in a substantially vertical direction,
wherein the metal layer of the wiring portion has a same thickness as the heat radiation portion,
wherein an entire region of the heat radiation portion is formed of the same metal layer as the metal layer of the wiring portion, and
wherein the heat radiation portion has a width wider than a width of the metal layer of the wiring portion.

2. The light emitting module according to claim 1, wherein the heat radiation portion of the module substrate includes a first side, a second side opposite to the first side, and a third side being the end of the heat radiation portion and disposed between the first side and the second side, and a width of the first side of the heat radiation portion is narrower than an interval between the center of the wiring portion and the third side,
wherein the heat radiation portion includes a first region adjacent to the first light emitting diode, a second region adjacent to the second light emitting diode and a third region adjacent to the third light emitting diode,
wherein a heat radiation area of the third region of the heat radiation portion is greater than a heat radiation area of the first region of the heat radiation portion.

3. The light emitting module according to claim 2, wherein the second side of the heat radiation portion has a width wider than that of the first side of the heat radiation portion,
wherein a width of the heat radiation portion is gradually disposed widely in a direction toward the second light emitting diode from the first light emitting diode,
wherein the second region has a heat radiation area of the second region of the heat radiation portion greater than the heat radiation area of the first region of the heat radiation portion.

4. The light emitting module according to claim 2, wherein the second side of the heat radiation portion has a width the same as that of the first side of the heat radiation portion,
wherein the heat radiation area of the third region of the heat radiation portion is greater than the heat radiation areas of the first region and the second region.

5. The light emitting module according to claim 2, wherein an interval between the second outer region of the wiring portion and the third side of the heat radiation portion is wider than an interval between the center of the wiring portion and the third side of the heat radiation portion,
wherein the heat radiation area of the third region of the heat radiation portion is smaller than the heat radiation area of the second region of the heat radiation portion.

6. The light emitting module according to claim 2, wherein an interval between the center of the wiring portion and the third side of the heat radiation portion is wider than an interval between the second outer region of the wiring portion and the third side of the heat radiation portion,
wherein the heat radiation area of the third region of the heat radiation portion is greater than the heat radiation area of the second region of the heat radiation portion.

7. The light emitting module according to claim 2, wherein the third side of the heat radiation portion is formed of a surface inclined with respect to the first side and the second side of the heat radiation portion.

8. The light emitting module according to claim 2, wherein the third side of the heat radiation portion includes a fourth side corresponding to the second side of the heat radiation portion,
wherein the fourth side is adjacent to the third light emitting diode.

9. The light emitting module according to claim 2, wherein the third side of the heat radiation portion includes a fifth side vertical to the first or second side of the heat radiation portion.

10. The light emitting module according to claim 7, wherein the inclined surface of the third side of the heat radiation portion is spaced apart from at least one of the first and second sides of the heat radiation portion,
wherein a length of the heat radiation portion is lengthily disposed to be closer to the wiring portion than the end of the heat radiation portion,
wherein the length of the heat radiation portion is an interval between the first side and the second side of the heat radiation portion.

11. The light emitting module according to claim 1, wherein a thickness of the wiring portion is thicker than a thickness of the heat radiation portion.

12. A light emitting module, comprising:
a plurality of light emitting diodes; and
a module substrate including a wiring portion disposed with the plurality of light emitting diodes and electrically connected to the plurality of light emitting diodes, and a heat radiation portion folded from the wiring portion and disposed under the plurality of light emitting diodes,
wherein the plurality of light emitting diodes includes a first light emitting diode disposed on a first outer region of the wiring portion, a second light emitting diode disposed on a second outer region of the wiring portion, and a third light emitting diode disposed on a center of the wiring portion,
wherein a width between the center of the wiring portion and an end of the heat radiation portion is wider than a distance between the first and second outer regions of the wiring portion and the end of the heat radiation portion, in the heat radiation portion of the module substrate,
wherein the wiring portion of the module substrate includes a metal layer, a wiring layer on the metal layer, and an insulating layer between the metal layer and the wiring layer,
wherein the heat radiation portion is extended from the metal layer,
wherein a top surface of the heat radiation portion is spaced apart from the insulating layer and the wiring layer, and
wherein the wiring layer includes a circuit pattern, and the wiring layer is electrically connected to the plurality of the light emitting diodes,
wherein the metal layer of the wiring portion is bent from the heat radiation portion in a substantially vertical direction,
wherein the metal layer of the wiring portion has a same thickness as the heat radiation portion,
wherein an entire region of the heat radiation portion is formed of the same metal layer as the metal layer of the wiring portion,
wherein the heat radiation portion has a width wider than a width of the metal layer of the wiring portion,
wherein a length of the heat radiation portion is lengthily disposed to be closer to the wiring portion than the end of the heat radiation portion, and
wherein the length of the heat radiation portion is an interval between a first side and a second side of the heat radiation portion.

13. The light emitting module according to claim 12, wherein a thickness of the wiring portion is thicker than a thickness of the heat radiation portion.

14. A backlight unit, comprising:
a bottom cover including a bottom portion, and a first side portion folded from the bottom portion;
a light guide plate disposed on the bottom portion of the bottom cover; and
a light emitting module comprising a module substrate including a wiring portion disposed on an inside of the first side portion of the bottom cover and corresponding to at least one side of the light guide plate, and a heat radiation portion folded from the wiring portion and disposed on the bottom portion of the bottom cover; and
a plurality of light emitting diodes disposed on the wiring portion of the module substrate and corresponding to at least one side of the light guide plate,
wherein the plurality of light emitting diodes includes a first light emitting diode disposed on a first outer region of the wiring portion, a second light emitting diode disposed on a second outer region of the wiring portion, and a third light emitting diode disposed on a center of the wiring portion and corresponding to a center of the at least one side of the light guide plate,
wherein a width between the center of the wiring portion and an end of the heat radiation portion is wider than a distance between the first outer region of the wiring portion and the end of the heat radiation portion, in the heat radiation portion of the module substrate,
wherein the heat radiation portion is disposed under a bottom surface of the light guide plate,
wherein the wiring portion of the module substrate includes a metal layer, a wiring layer on the metal layer, and an insulating layer between the metal layer and the wiring layer,
wherein the heat radiation portion is extended from the metal layer, and the heat radiation portion is spaced apart from the insulating layer, and
wherein the wiring layer includes a circuit pattern, and the wiring layer is electrically connected to the plurality of the light emitting diodes,
wherein the metal layer of the wiring portion is bent from the heat radiation portion in a substantially vertical direction,
wherein the metal layer of the wiring portion has a same thickness as the heat radiation portion,
wherein an entire region of the heat radiation portion is formed of the same metal layer as the metal layer of the wiring portion,
wherein an entire top surface of the heat radiation portion has an area smaller than an area of a bottom surface of the light guide plate, and
wherein the heat radiation portion has an area smaller than an area of the bottom portion of the bottom cover.

15. The backlight unit according to claim 14, further comprising a connecting member between the module substrate and the side portion and the bottom portion of the bottom cover, wherein the connecting member includes an adhesive member.

16. The light emitting module according to claim 1, wherein the wiring portion includes a protection layer on the wiring layer having a circuit pattern.

17. The light emitting module according to claim 2, wherein the first region, the second region and the third region have a widths different from each other, and
 wherein the first region, the second region and the third region of the heat radiation portion have a heat radiation areas different from each other.

18. The backlight unit according to claim 14, wherein the heat radiation portion has a width wider than a width of the metal layer of the wiring portion.

19. The backlight unit according to claim 14, wherein the bottom portion includes a recess concaved from a part of a top surface of the bottom portion,
 wherein the heat radiation portion is disposed in the recess of the bottom portion of the bottom cover.

20. The backlight unit according to claim 19, further comprising a first adhering member adhered between the metal layer of the wiring portion and the first side portion of the bottom cover, and a second adhering member adhered between the heat radiation portion and a surface in the recess.

* * * * *